Dec. 11, 1956 C. D. NESTLERODE 2,773,989

SHIELDING MEANS FOR ELECTRICAL TUNING DEVICES

Filed Oct. 15, 1952

INVENTOR.
CLIFFORD D. NESTLERODE
BY Darby & Darby
ATTORNEYS

United States Patent Office 2,773,989

Patented Dec. 11, 1956

2,773,989

SHIELDING MEANS FOR ELECTRICAL TUNING DEVICES

Clifford D. Nestlerode, Packanack Lake, N. J., assignor to Allen B. Du Mont Laboratories, Inc., Clifton, N. J., a corporation of Delaware Application October 15, 1952, Serial No. 314,854

4 Claims. (Cl. 250—40)

Figure 1:
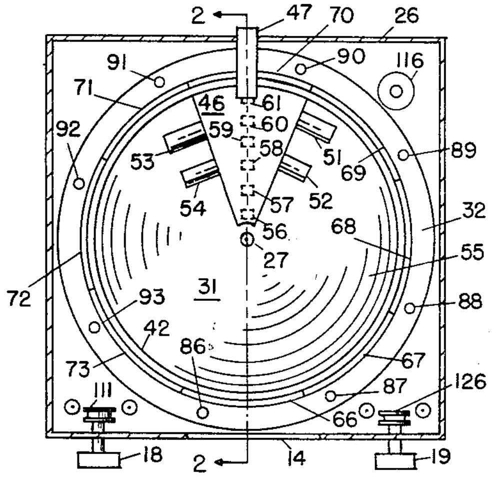

The present invention relates to shielding means for electrical tuning devices and particularly to a novel means for shielding the circuit disk and tuning disk disclosed in the copending patent application of David C. Felt, Serial No. 314,851, filed October 15, 1952, and assigned to the assignee of this application.

In the copending application referred to there is provided a tuning device which comprises two flat disks positioned on a common axis with their adjacent surfaces separated by a small air gap. One of the disks, known as a circuit disk, comprises a plurality of sets of circuits or coils, the coils of each set being positioned along radial lines and the sets being angularly disposed with relation to each other. The terminals of the tunable coils or circuits are connected to connector pins which extend to the opposite surface of the disk and are adapted to make contact with a stationary set of contacts in an electric circuit unit which is suitably positioned for this purpose and which may comprise amplifier, oscillator, or mixer circuits and the like tuned by the corresponding coils or frequency determining elements.

The second disk or tuning disk is provided on the surface adjacent the frequency determining elements with a plurality of sets of electrically conductive tuning or shading elements. The number of sets of tuning elements corresponds to the number of sets of frequency determining elements. The construction further comprises means for rotating the tuning disk with respect to the circuit disk so that the resonant frequency of the frequency determining elements of the circuit disk may be changed as the tuning disk is rotated. Also, means are provided for rotating the circuit disk to selectively engage sets of frequency determining elements with the stationary contacts of the electrical circuit unit.

The tuning device above, generally described, although generally excellent in efficiency and performance of its required functions, has the disadvantage that there are capacitive and inductive electrical effects and inter-action between the circuit disk, the tuning disk, and the electron tubes and other components of the amplifier, oscillator, and mixer circuits in the stationary electrical circuit unit.

The present invention provides a shielding plate which functions to shield the circuit and tuning disks from the stationary circuit unit 46 thus preventing the detrimental capacitive and inductive electrical inter-action above-mentioned.

It is an object of the invention to provide a tuning device of the type disclosed in the above-mentioned Felt application wherein the detrimental inductive and capacitive effects and inter-action between the circuit and tuning disks and the stationary circuit elements such as oscillators, amplifiers, mixers and the like is reduced or eliminated.

It is another object of the invention to produce such a shielding means which is readily adapted to use with the tuning device above-mentioned without increasing its bulk or otherwise disadvantageously affecting its configuration or operation.

Figure 2:
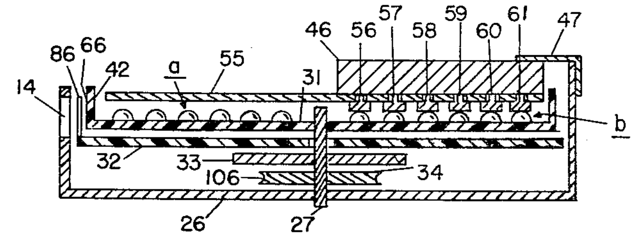
Figure 3:
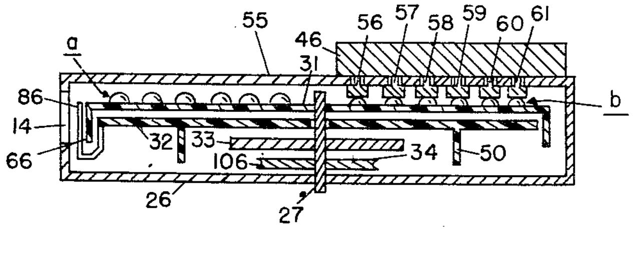

Other objects and features of the invention will be apparent when the following description is considered in connection with the annexed drawings, in which, Figure 1 is a top plan view of a tuning device embodying the present invention;

Figure 2 is a vertical cross-sectional view taken on the plane of the line 2—2 of Figure 1 showing a preferred arrangement of a shielding plate in accordance with this invention as respects the arrangement of the circuit and tuning disks; and Figure 3 is a vertical cross-sectional view similar to Figure 2 showing a modification of the invention in which the shielding function is performed by a portion of the metallic housing of the tuning device.

The tuning device to which the present invention is applied comprises a housing 26 having a generally flat square shape and having an opening 14 in its forward wall. Journalled in this forward wall are a coarse tuning knob 18 and a vernier tuning knob 19. A spindle 27 is journalled at the approximate center of the bottom portion of the housing 26 and fixed to this spindle is a circuit disk 31. A tuning disk 32 is rotatably mounted on the spindle 27 below and with its upper surface parallel to and closely adjacent to the lower surface of the circuit disk 31. Fixed to the spindle 27 is a control disk or cam 33 as well as a pulley 34. The circuit disk 31, cam 33, pulley 34 and spindle 27 are thus rotatable in unison whereas the tuning disk 32 is rotatable independently of the tuning disk. However, sufficient frictional contact exists between the spindle 27 and the bearing portion of the disk 32 so that the disk 32 will move with the disk 31 and will move independently of the disk 31 only when the disk 31 is constrained against movement.

A plurality of sets of contact pins extend through the circuit disk 31 and are arranged so that the pins of each set extend along substantially radial lines of the circuit disk the various sets of pins being preferably equally spaced apart angularly. Representative sets of pins are indicated in Figures 2 and 3 and are designated *a* and *b*. Sets of frequency determining elements such as coils, capacitances and the like are mounted on the lower surface of the circuit disk 31. These elements are not shown in the drawings but are described in detail in the Felt application above-identified.

A corresponding plurality of sets of tuning elements is fixed to the upper face of the tuning disk 32 these tuning elements preferably being tapered in the manner described in the Felt application. Cooperating with the contact pins of the circuit disk are a single set of contact pins of an electrical circuit unit 46 which is positioned above the circuit disk.

In the form of my invention shown in Figure 1 an annular rim 42 extends upwardly from the outer edge of the disk 31 and the circuit unit mounted on bracket 47 is positioned substantially within the confines of the rim. The circuit unit 46 may have electron tubes, transformers, transistors or the like 51, 52, 53 and 54 mounted thereon.

In accordance with the present invention a shield plate 55 is positioned between the circuit unit and the circuit disk 31. In the form of the invention shown in Figures 1 and 2 the shield plate is a circular disk which fits within the rim 42. The stationary contacts designated 56 through 61 of the circuit unit 46 extend through suitable openings in the shield plate 55 these openings being either insulatingly bushed or larger than the shanks of the contact pins since of course no short-circuiting is permissible.

In the preferred embodiment of the tuning device eight sets of frequency determining units are utilized and, in order to indicate the positions of the circuit disk with respect to the circuit unit and of the tuning unit with respect to the stationary circuit unit and the circuit disk, eight indicia scales 66 through 73 are arranged in equal segments on the outer periphery of the rim 42 of the disk 41 and the corresponding number of indicators or pointers 86 are attached to the tuning disk near its periphery and extend upwardly in front of the outer surface of the rim 42 of the circuit disk 12. The tuning disk 32 has a larger diameter than the circuit disk 31 in order that the pointers 86 to 93 may lie in front of the circuit disk rim 42.

As is indicated in detail in the copending Felt application means are provided to operate the circuit disk and the tuning disk the means comprising generally a belt drive from the control knob 18 the belt passing over an annular groove 106 on the pulley 34 so that when the coarse tuning knob is turned the circuit disk 31 and control or cam disk 33 rotate as a unit. The tuning disk also rotates due to frictional engagement of this disk with the spindle 27 and with the cam disk 33.

To accomplish vernier tuning a vernier drive wheel 116 is positioned near the rim of the tuning disk 32. The vernier tuning knob 19 has a drive pulley 126 connected thereto and a driving belt (not shown) engages the pulley 126 and the vernier drive wheel 116. Also a link or lever (not shown) is arranged to be controlled by the cam 33 to position the drive wheel 116 in contact with the rim of the tuning disk when the circuit disk 31 is in any of its operating positions thereby providing for vernier movement of the tuning disk while the circuit disk is stationary and a set of pins thereon is in contact with the set of pins of the stationary electrical circuit unit 46.

A modified form of the invention is illustrated in Figure 3. In this arrangement the shield plate 55 comprises a part of the housing 26 and in this case the rim 66 of the circuit disk 31 extends downwardly rather than upwardly and the pointers 86 are modified so that they are in the form of U-shaped members which extend first downwardly from the tuning disk 32 and then upwardly in front of the rim 66 of that disk.

In both forms of the invention the shield plate 55 functions to shield the circuit disk 31 and tuning disk 32 from circuit unit 46 thus preventing capacitive and inductive electrical inter-action between the disks 31 and 32 and the tubes 51 through 54 or other components of the electrical circuits of the circuit unit 46. Thus the shield 55 limits the electrical effects of the disks 31 and 32 on the circuits 46 to those which occur directly through the contacts 56 through 61 and the tuning unit operates more reliably and more nearly in accordance with its theoretical design properties than when the shield plate is omitted. Furthermore the shield plate is of such configuration and is so incorporated into the structure of the tuning unit that the physical size of the tuning device is not appreciably affected by its use.

While preferred embodiments of the invention have been shown and described it will be obvious to those skilled in the art that various modifications may be made. I wish, therefore, to be limited not by the foregoing description but solely by the appended claims.

What is claimed is:

1. A tuning device comprising a circuit disk rotatable about an axis and having a contact pin thereon, means to rotate said disk, a shielding housing substantially enclosing said disk, an electric circuit unit positioned outside of and affixed to said housing, an opening through said housing, and an electric contact member extending from said circuit unit and through said opening and terminating at a point to selectively engage said contact pin at a predetermined position of said disk.

2. A tuning device comprising a shielding housing, a circuit disk having a contact pin thereon positioned within said housing near and substantially parallel to an inner surface thereof and rotatable about an axis, a rim on said disk extending laterally away from said inner surface of said housing, means to rotate said disk, an electric circuit unit positioned outside of and affixed to said housing, an opening through said housing, and an electric contact member extending from said circuit unit and through said opening and terminating at a point to selectively engage said contact pin at a predetermined position of said disk.

3. The device in accordance with claim 2, including a tuning disk rotatable about said axis and positioned within the confines of said rim, and means to rotate said tuning disk.

4. The device in accordance with claim 3, including a scale indicia on the outer surface of said rim, an opening in said housing through which said scale is visible, and an indicator member projecting from said tuning disk and extending beyond the outer edge of said rim whereby said indicator is visible through said last-named opening.

References Cited in the file of this patent

UNITED STATES PATENTS

| | | |
|---|---|---|
| 2,078,908 | Harrison | Apr. 27, 1937 |
| 2,078,909 | Gunther | Apr. 27, 1937 |
| 2,113,961 | Hotopp | Apr. 12, 1938 |
| 2,419,986 | Brown | May 6, 1947 |
| 2,513,392 | Aust | July 4, 1950 |
| 2,643,361 | Mackey | June 23, 1953 |
| 2,668,235 | Nordby | Feb. 2, 1954 |
| 2,682,645 | Patla | June 29, 1954 |